United States Patent
Lisart et al.

[11] Patent Number: 5,889,720
[45] Date of Patent: Mar. 30, 1999

[54] CIRCUIT FOR THE PRODUCTION OF A PROGRAMMING HIGH VOLTAGE

[75] Inventors: Mathieu Lisart; Laurent Sourgen, both of Aix En Provence, France

[73] Assignee: SGS-Thomson Microelectronics S.A., Saint Genis, France

[21] Appl. No.: 852,104

[22] Filed: May 6, 1997

[30] Foreign Application Priority Data

May 7, 1996 [FR] France .................................. 96 05719

[51] Int. Cl.[6] .................................................. G11C 13/00
[52] U.S. Cl. ...................................... 365/226; 365/189.01
[58] Field of Search ................................... 365/226, 227, 365/189.01, 230.01

[56] References Cited

U.S. PATENT DOCUMENTS 4,628,487  12/1986  Smayling ................................ 365/185
5,193,073  3/1993  Bhuva .................................... 365/226

OTHER PUBLICATIONS

Prench Search Report from French Patent Application 96 05719, filed May 7, 1996.
Proceedings IEEE Custom Integrated Circuits Conference, May 16–19, 1988, New York, US, pp. 4.2.1–4.2.4, Carney, et al., "Configurable EEPROMs For ASICs".

*Primary Examiner*—Terrell W. Fears
*Attorney, Agent, or Firm*—Wolf, Greenfield & Sacks, P.C.

[57] ABSTRACT

To form a ramp signal for the programming of a memory cell without losing excess voltage in a control circuit, the output of a voltage pull-up circuit is connected to the programming input using a P type transistor. It is shown that this P type transistor then charges the memory array at constant current, prompting a linear increase of the voltage. This results in preventing the memory cell that is to be programmed from being subjected to excessively sudden variations of voltage. It is shown that by acting in this way, the integrated circuit can be made to work even with very low voltages.

16 Claims, 2 Drawing Sheets

CIRCUIT FOR THE PRODUCTION OF A PROGRAMMING HIGH VOLTAGE

BACKGROUND OF THE INVENTION

1. Field of the Invention

The invention is directed to circuits that provide programming high voltages, and more particularly, to circuits that program non-volatile type memory cells including floating-gate transistors as storage elements. The invention can be used further for programming other types of memory cells, including static and dynamic memories, insofar as the progress of their programming voltage needs to be checked. With the invention, it is possible to control the development of this programming voltage when it is set up. More generally, the invention provides control for the progress of any voltage whatsoever.

2. Discussion of the Related Art

In the field of non-volatile memories, the cells of which are EPROM, EEPROM or Flash EPROM type cells, it is usually necessary to apply a high voltage of about 20 volts to store charge in a floating gate of a floating-gate transistor. Normally, an external supply circuit possesses a supply circuit to produce this high voltage. However, when the integrated circuit for which a programming high voltage has to be produced is a mounted circuit, in particular when it is a chip of a chip card or a circuit board, the programming high voltage has to be produced within the integrated circuit. It is possible, using a general supply low voltage, for example equal to 5 volts, to produce high internal voltages, for example of the order of 20 volts.

The development of technologies is now leading to the recommending of general supply voltages of lower values, for example 3 volts, or even 1.8 volts. The usefulness of these approaches using very low voltage is that the total energy dissipated in an integrated circuit is reduced: its temperature is therefore lower, and it works more efficiently. Furthermore, with the miniaturization of circuits, breakdown voltages or voltages corresponding to a change in state are reduced so that a low voltage supply becomes a necessity. However, despite this miniaturization, it is still necessary to have recourse to programming high voltages.

The principle of the production of a programming high voltage within an integrated circuit consists of the use of a voltage pull-up circuit within this integrated circuit. A voltage pull-up circuit is constituted for example by a Schenkel type multiplier or else by a charge pump. The technique of making these pull-up circuits is such that, for a given supply voltage, for example 5 volts, the value of the high voltage produced is limited by a maximum, for example 20 volts. If the supply voltage is lower, for example 3 volts, it is still possible to produce potential differences of 18 volts by producing positive voltages and negative voltages in the circuit. However, there then arises a problem of cost related to this complexity of the circuit. Such costs and complexity are increased if the supply voltage is lower than 3 volts.

Besides, fan-out of the voltage pull-up circuit, especially when it is a charge pump, decreases as the programming high voltage produced increases above the starting general supply voltage. In view of the fact that memory arrays, namely bit lines, do not have perfect insulation, there are electrical leakages which, in combination with technical constraints related to making the voltage pull-up circuit, lead to choosing the maximum permissible values for the programming voltages. In practice, it is observed at the present time that the highest possible programming voltage is limited by about 18 volts for a voltage of 1.8 volts.

When a programming high voltage is to be applied to a memory cell, it should not be applied suddenly. Otherwise there is a risk of causing the deterioration of a gate oxide layer placed between a floating gate and a drain or source region of the floating-gate transistor to be programmed. To avoid this problem, a voltage ramp is produced from the programming high voltage. The slope of this ramp, which increases as a function of time, is calibrated so that it remains smaller than a critical slope. The circuit that sets up the voltage ramp has an N type transistor connected by its drain to a source of programming high voltage (that is constant), and by its source to the place of application of the voltage ramp. To the gate of this N type transistor, there is applied a signal that increases regularly with time so as to control the voltage available at the source. It can be seen then that this voltage available at the source follows, except for a drop in voltage VTN, the value of the signal applied to the control gate of this N type transistor.

Now, the drop in voltage really caused in the N type transistor is actually an addition of the following two values: a drop in voltage intrinsic to the N type transistor and a drop in voltage related to the difference between the source voltage of the N type transistor and the substrate voltage of the integrated circuit. Generally, a total difference of 2 volts is the value chosen. This means that all that is available thereafter is a maximum end-of-ramp voltage of 16 volts. If a voltage greater than 16 volts is desired, the DC programming high voltage must be increased to the detriment of the fan-out of the charge pump. Consequently, the problem is not truly resolved for, when the circuit lets through current, this voltage drops.

SUMMARY OF THE INVENTION

An embodiment of the invention overcomes the above-described problem by providing a different approach. Rather than control the voltage available at the source of an N type transistor, the embodiment controls the flow rate of current flowing through a P type transistor connected to the output of the voltage pull-up circuit. By the series-connection of a capacitor with this P type transistor, there is then obtained a charging of the capacitor, at constant current, and hence a linearly increasing voltage. In one embodiment, the capacitor may be formed solely by the set of connections, the bit lines or bit words, of the memory array of the memory to be programmed. The charge at constant current is obtained by biasing the P type transistor at the limit of conduction with a calibrated difference. For a constant current, this difference is constant. This means that, during this gradual charging process, the signal to be applied to the control gate of the P type transistor is itself constant. This is simpler. Since the P type transistor does not have any drop in conduction voltage of the same type as the N type transistor, there is ultimately obtained a ramp voltage that can culminate in a value greater than the value at which the voltage obtained according to the related art is capable of culminating, by using one and the same programming high voltage (of 18 volts for example).

An embodiment of the invention is directed to a circuit for the production of a programming high voltage including:

a voltage pull-up circuit, the output of which delivers a DC high voltage, and a control circuit for the production, on the basis of the DC high voltage, of a programming high voltage in ramp form, including a command circuit that provides a gate signal; and a first P type load transistor connected by its source to the output of the pull-up circuit, by its drain to a capacitor and by its control gate to the command circuit, the programming high voltage being available at this drain.

BRIEF DESCRIPTION OF THE DRAWINGS

The invention will be understood more clearly from the following description and from the appended figures. These figures are provided for illustration purposes and in no way restrict the scope of the invention. Of these figures.

DETAILED DESCRIPTION

Figure 1:
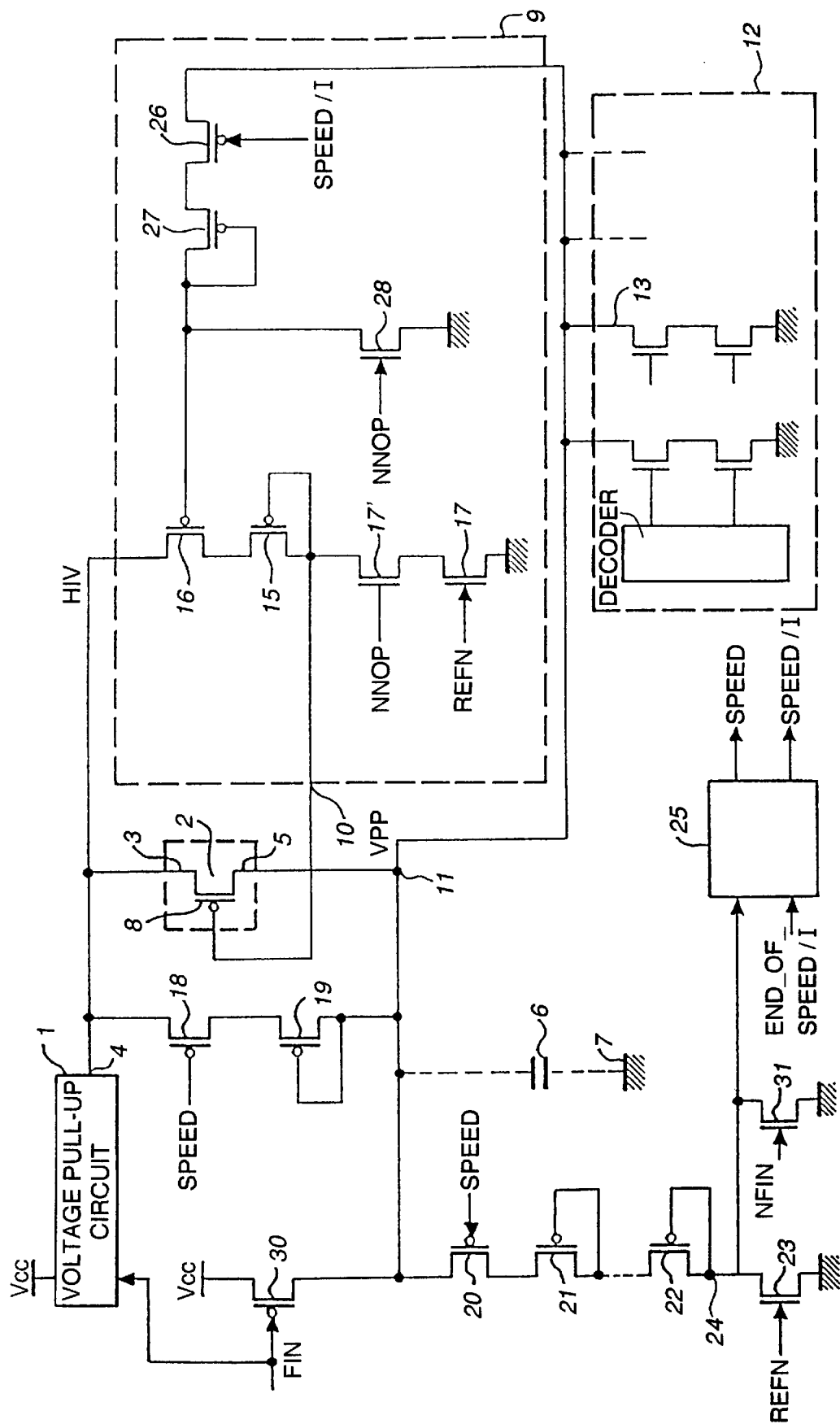
FIG. 1 shows an exemplary embodiment of a circuit according to the invention.

FIG. 1 shows a circuit for the production of a programming high voltage according to the invention. This circuit has a voltage pull-up circuit 1. The pull-up circuit 1, which is supplied with a voltage VCC, delivers a DC high voltage HIV. Although this is not shown herein, the pull-up circuit 1 has a regulation circuit so that the value HIV is regulated at a value chosen beforehand. In one embodiment, HIV equals 18 volts. The circuit of the invention also has a control circuit for the production, from the DC high voltage HIV, of a programming high voltage in ramp form VPP. The shape of this programming high voltage in ramp form VPP can be seen in FIG. 2. The control circuit of the invention has a first P type load transistor 2 (in the drawing it has a small circle on its control gate). The transistor 2 is connected by its source 3 to the output 4 of the pull-up circuit 1. It is connected by its drain 5 to a capacitor 6 to be charged. The capacitor 6 is connected by its other terminal to an electrical ground 7 or to another reference potential. The transistor 2 is connected by its control gate 8 to a command circuit 9 forming part of the control circuit.

The command circuit 9 is shown herein solely for its parts useful for the understanding of the technical effect of the invention. It has several other functions that correspond, in particular, to operations for the validation of efficient functioning. The command circuit 9, supplied by the output 4, receives certain signals herein known as NOP and SPEED/I. At its output 10, it delivers a signal to be applied to the control gate 8 of the transistor 2.

A connection 11 at which there is available the voltage VPP is connected, for example, to a memory array 12 of the memory of the integrated circuit that further contains the circuit of the invention. The bit line connections 13 of this memory 12 have a capacitance and are equivalent to the capacitor 6. The capacitor 6 may therefore be left out if the transistor 2 is computed accordingly so that the current that it lets through, by charging the useful capacitor of the memory array 12, is such as to prompt a suitable increase 14 (FIG. 2) of the voltage VPP.

The adjusting of the current that flows through the transistor 2 is obtained by the imposition, on the gate of this transistor 2, of a voltage substantially equal to HIV–VTP–. According to an embodiment of the invention, HIV is equal to 18 volts, VTP is equal to 1.4 volts and epsilon is of the order of 0.2 volts. With a value of this kind, it is possible to obtain a charging current of 10 microamperes corresponding to the ramp 14 (see FIG. 2). A current calibrated in this way is obtained simply in one embodiment by the parallel connection of a P type transistor 15, mounted as a diode, with the source and the control gate of the transistor 2.

Figure 3:
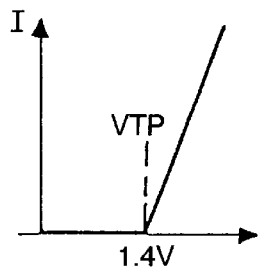
FIG. 3 shows a useful part of a characteristic curve of a P type transistor mounted as a diode.

FIG. 3 shows an exaggerated view of the shift and shape of the voltage VTP obtained with a P type transistor mounted as a diode when it is conductive. In the example, the basic shift is equal to 1.4 volts. This basic shift is complemented by an ohmic drop in conduction in the diode linked to the conduction resistance of this diode. This leads to a characteristic that is inclined and not vertical beyond VTP. To control the conduction of the transistor 2, it is enough to apply this voltage shift to the control gate 8. This is done simply in the example by connecting the diode 15 to the programming high voltage HIV for example by means of a P type transistor 16 receiving an appropriate signal at its control gate. When the transistor 16 is conductive (it does not prompt any drop in voltage since it is a P type transistor), the shift in calibrated voltage is applied to the gate 8. It is therefore enough to apply a voltage level to the control gate of the transistor 16 so that it becomes conductive. It is not necessary to produce a ramp as a control signal. Indeed, once the transistor 2 is conductive, it is conductive at constant current (the value of this constant current is related firstly to the geometry of this transistor, secondly to the value of the shift, and thirdly to the value of the capacitor formed by the memory array 12 and/or the capacitor 6). Under these conditions, the voltage VTP follows a ramp 14 as indicated here above.

In the invention, it has been realized that once the voltage VPP reaches its nominal value, there is no longer any charging at constant current since VTP is close to HIV. This is not a problem since the nominal voltage is achieved. However, for the programming, it may then be necessary to have available a current greater than the 10 microamperes to which the charging had been limited. To this end, in the invention, when the nominal voltage is reached, the transistor 16 is turned off and the drain of the transistor 15, and hence the gate of the transistor 2, are connected to ground by means of two cascade-connected N type transistors 17 and 17'. The transistor 17 is controlled by a signal REFN (constant) that turns this transistor 17 on at the limit of conduction. This means that the transistor 17 is capable of letting through only a low current, for example of between 1 microampere and 2 microamperes. The transistor 17' receives a command signal NNOP that turns it on after the nominal voltage has been reached (see FIG. 2).

This low current makes its possible to bring about a drop at the drain of the transistor 15 well beyond HIV–VTP–epsilon. Thus, when the ramp 14 has reached its maximum, the voltage available at the gate 8 gets discharged by the transistors 17 and 17'. The result thereof is that the transistor 2 which hitherto had been controlled so as to let through a calibrated current will now be activated in saturation mode. It is then capable of letting through a current of 100 microamperes if necessary. In the invention, at the end of the ramp, the value of the current that the transistor 2 is capable of letting through will therefore be increased.

The slope of the ramp 14 should be controlled only from the instant at which the voltage VPP reaches a critical zone corresponding to the beginning of a tunnel effect in the programming of the floating-gate transistors. For example, this critical voltage is of the order of 10 volts. Rather than producing a ramp 14 that increases from 0 volts or at least from the supply voltage of the integrated circuit, VCC, up to the nominal value, it is preferred in the invention to bring about a swift rise in the voltage VPP, during a first period, before controlling an increase 14 that is slower.

This could be achieved in theory with the transistor 2 which alone would be controlled accordingly. In a first stage, the control gate 8 would be taken to zero since it would be taken to a calibration value during the build-up 14 before being brought back to zero when the nominal voltage has been reached. In a preferred embodiment, another P type transistor 18 is made in addition. The transistor 18 is bigger than the transistor 2. For example, its width is ten times greater. It can let through ten times more current. The transistor 18 is parallel-connected to the transistor 2 and is controlled by an acceleration signal SPEED (see FIG. 2). The signal SPEED has a value HIV in normal time. During the fast charging of the capacitor 6, the signal SPEED is taken to a very low level, close to 0 volts. At the time of this fast charging, the transistor 18 is conductive. For practical reasons, the transistor 18 is cascade-connected with a diode-mounted transistor 19. The signal SPEED, produced externally to the circuit, may be switched over by a clock connected to a sequencer.

The negative pulse of the signal SPEED which makes the transistor 18 conductive also uses the control of a P type transistor 20 to put into operation a sequence of P type transistors 21 to 22. The transistors 21 to 22 are diode-mounted. They are cascade-connected with one another and with an N type transistor 23 between the node 11 and the ground. The transistor 23 is biased at the limit of conduction by the signal REFN. In normal times, a node 24 that is intermediate between the sequence of transistors 21 to 22 and the transistor 23 is taken to 0 volts. When the signal SPEED is applied, owing to the build-up in voltage of the node 1, a time comes when the transistor 20 and the diodes 21 to 22 become conductive. Under these conditions, the transistor 23, at the limit of conduction, tends to remain off so that the voltage at the node 24 rises. Assuming that a drop in voltage of the order of 1.4 volts occurs in each of the diodes 21 to 22, by the cascade-connection of six diodes in one embodiment, and assuming that the drop in voltage in the transistor 23 is of the order of 2 volts, there is obtained a switch-over of the signal available at the node 24 from 0 to 2 volts when VPP is about 10 volts. The signal at the node 24 is used firstly to prompt the return switch-over of the signal SPEED to its high value. In other words, the level of the signal SPEED is produced by a command external to the integrated circuit. Its return is prompted by the signal of the node 24. It is possible, with a logic circuit 25 including notably D type flip-flop circuits, to easily set up such a function.

Figure 2:
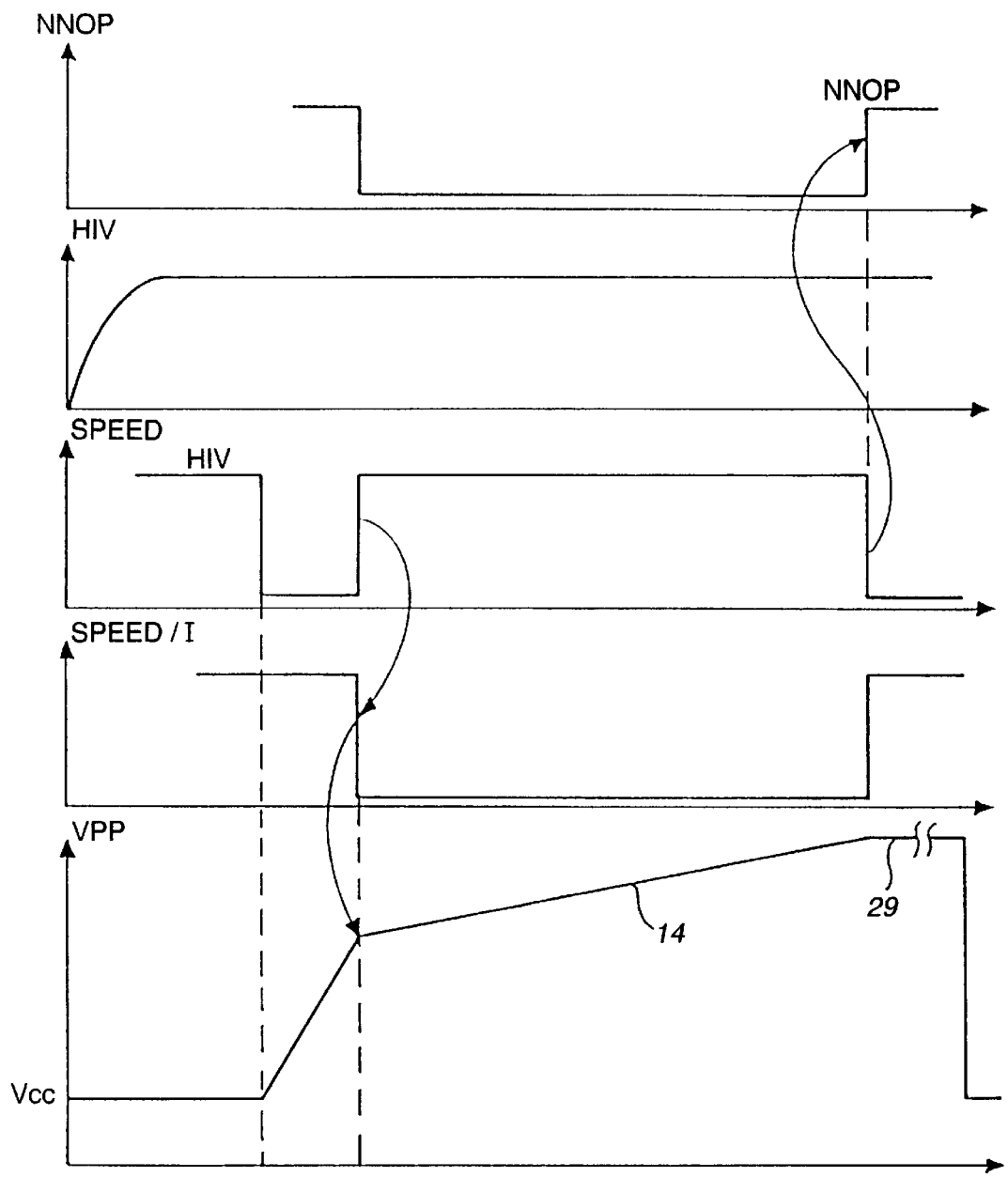
FIG. 2 shows timing diagrams of signals implemented in the circuit of FIG. 1.

In doing so, when the signal SPEED rises up to the value HIV, it is possible secondly to make the ramp 14 start. The signal available at the node 24 is then used also for the production, in the circuit 25, of a pulse signal SPEED/I that is the reverse of the signal SPEED after the rapid charging that will bring about the ramp 14. FIG. 2 gives a view, for the signals SPEED, SPEED/I and VPP, of the chronological implications.

The circuit 9, which has been simplified to its useful elements, includes a P type transistor 26, cascade-connected with a P type transistor 27 mounted as a diode. The transistor 26 supplied by VPP receives the signal SPEED/I at its control gate. An N type transistor 28 is connected between the control gate of the transistor 16 and ground. It is activated at the limit of conduction by a signal NNOP applied to its control gate. At the time of the rapid charging (from 0 to 10 volts), the signal NNOP is such that the transistor 28 is on and makes the transistor 26 highly conductive. The node 10 is then drawn to zero. When the ramp 14 starts (FIG. 2), the transistor 26 is turned on by the signal SPEED/I going to 0 volts. The transistor 28 is off. Under these conditions, the gate of the transistor 16, connected to this cascade of P transistors 26 and 27, is taken to a potential whose value is substantially VPP–VTP–epsilon. It follows VPP apart from one value of VTP. Consequently, while the signal SPEED rising to HIV turns the transistor 18 and the transistor 20 off, the signal SPEED/I at zero turns on the transistor 16 which itself makes the transistor 2 conductive in a calibrated way. The slope of the charge of the capacitor 6 becomes smaller.

Just as the signal SPEED is introduced through an external command, the end of the signal SPEED/I is produced by an external time lag. The end of the SPEED/I signal is for example applied to a switch-over input of a circuit 25. At this time, the signal SPEED/I which was originally at 0 volts rises again to a high voltage turning the transistor 26 off. Under these conditions, the control gate of the transistor 16 would remain at a relatively high voltage if nothing were to be done. By connecting this gate through the highly resistive N type transistor 28 to the ground, this node is discharged so that the control gate of the transistor 16 receives a decreasing potential: the transistor 16 becomes increasingly conductive. Under these conditions, the voltage at the control gate of the transistor 2, charged by the transistor 17, drops. The transistor 2 becomes increasingly conductive: it is capable of letting through 100 microamperes that are necessary whereas only 10 microamperes were tolerated during the build-up of the voltage along the slope 14.

After the build-up 14, the signal VPP therefore goes through a plateau 29 whose duration is dictated by an external circuit. This duration corresponds to the duration required for the programming of the memory cells. In practice, this duration is of the order of one millisecond. At the end of this duration, an external signal FIN at zero is used to disable the pull-up circuit 1 and a P type transistor 30, connected between the supply voltage VCC of the integrated circuit and the node 11, is made conductive. Owing to the limited fan-out of the pull-up circuit 1, the voltage VPP falls again to VCC. This is furthermore obtained by connecting the node 24 to an N type transistor 31 which receives, at its control gate, a signal NFIN that is complementary to the signal FIN. With the transistor 31 becoming highly conductive, the arm of the transistors 20–22, 31 discharges the node 24 below 10 volts. The commands REFN, NNOP, end of SPEED/I and FIN are applied by an external circuit. In the invention, the ramp command mode furthermore enables the application of the signal SPEED at a random instant after the one where the potential HIV is stabilized at output of the pull-up circuit 1.

Figure 4:
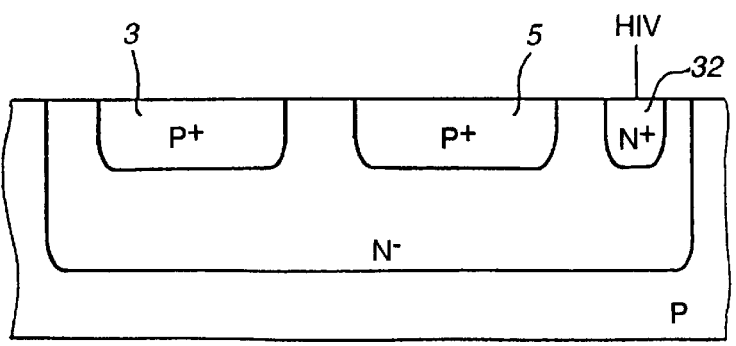
FIG. 4 gives a schematic view of a P type transistor according to the invention.

FIG. 4 shows the embodiment of a P type transistor in an N-type well of a P type substrate. In view of the voltages brought into play, the wells will be taken by a well contact 32 (N+zone) to the potential HIV.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A production circuit for producing a programming high voltage, comprising:
 a voltage pull-up circuit having an output that provides a DC high voltage; and
 a control circuit that provides, from the DC high voltage, the programming high voltage in ramp form, the control circuit including:

a command circuit, and a first P type load transistor having a source connected to the output of the pull-up circuit, a drain connected to a capacitor, and a control gate connected to the command circuit, the programming high voltage being provided at the drain of the first P type load transistor.

2. The production circuit of claim 1, wherein the command circuit includes:

a pulse generator to apply a voltage level to the control gate of the first P type load transistor.

3. The production circuit of claim 1, wherein the capacitor is formed by bit lines of a memory array.

4. The production circuit of claim 1, wherein the command circuit includes:

a P type transistor mounted as a diode, the P type transistor mounted as the diode having a source connected to the source of the first P type load transistor, and a control gate and a drain connected to the control gate of the first P type load transistor, in order to charge the capacitor at constant current.

5. The production circuit of claim 4, wherein the drain of the P type transistor mounted as the diode is further connected to a highly resistive circuit including an N type transistor that is series-connected between the drain of the P type transistor mounted as the diode and a reference potential.

6. The production circuit of claim 1, wherein the command circuit includes a circuit to apply a voltage level at a random date included in a range of duration.

7. The production circuit of claim 1, wherein the control circuit further includes:

a second load transistor, parallel-connected with the first P type load transistor, the second load transistor being larger than the first P type load transistor, to let through a larger current for charging the capacitor during a first period of production of the programming high voltage.

8. The production circuit of claim 1, wherein the command circuit includes a circuit to saturate the first P type load transistor after a period of charging at constant current.

9. A programming circuit for providing a programming voltage, the programming circuit receiving a supply voltage from a supply voltage source, the programming circuit comprising:

a voltage pull-up circuit having an input to receive the supply voltage, and an output to provide a pull-up voltage that is higher than the supply voltage;

a first P type load transistor having a source coupled to the output of the voltage pull-up circuit to receive the pull-up voltage, a gate, and a drain;

a command circuit including a diode connected transistor having a source coupled to the source of the first P type load transistor, and a gate and a drain coupled to the gate of the first P type load transistor; and an output terminal coupled to the drain of the first P type load transistor, the output terminal providing the programming voltage.

10. The programming circuit of claim 9, wherein the command circuit provides a control signal to the gate of the first P type load transistor so that the first P type load transistor operates in a non-saturated mode during a first time period, and a saturated mode during a second time period after the first time period.

11. The programming circuit of claim 10, wherein the programming voltage provided by the output terminal increases at a first rate during the first time period, and wherein the programming circuit further comprises:

a second P type load transistor having a source coupled to the source of the first P type load transistor, a gate, and a drain coupled to the output terminal; and control circuitry having an output coupled to the control gate of the second P type load transistor, wherein the control circuitry provides an output signal to the gate of the second P type load transistor so that the second P type load transistor is turned on during a third time period, and is turned off during the first time period, wherein the third time period occurs before the first time period, and wherein the second P type load transistor is larger in size than the first P type load transistor so that, when the second P type load transistor is turned on during the third time period, the programming voltage provided by output terminal increases at a second rate that is higher than the first rate during the first time period.

12. A programming circuit for providing a programming voltage, the programming circuit receiving a supply voltage from a supply voltage source, the programming circuit comprising:

a voltage pull-up circuit having an input to receive the supply voltage, and an output to provide a pull-up voltage that is higher than the supply voltage;

a first P type load transistor having a source coupled to the output of the voltage pull-up circuit to receive the pull-up voltage, a gate, and a drain;

an output terminal coupled to the drain of the first P type load transistor; and means for controlling the first P type load transistor so that the output terminal provides the programming voltage.

13. The programming circuit of claim 12, wherein the means for controlling includes means for providing a control signal to the gate of the first P type load transistor so that the first P type load transistor operates in a non-saturated mode during a first time period, and a saturated mode during a second time period after the first time period.

14. The programming circuit of claim 13, wherein the programming voltage provided by the output terminal increases at a first rate during the first time period, and wherein the programming circuit further comprises:

a second P type load transistor having a source coupled to the source of the first P type load transistor, a gate, and a drain coupled to the output terminal; and means for controlling the second P type load transistor so that the second P type load transistor is turned on during a third time period, and is turned off during the first time period, wherein the third time period occurs before the first time period, and wherein the second P type load transistor is larger in size than the first P type load transistor so that, when the second P type load transistor is turned on during the third time period, the programming voltage provided by output terminal increases at a second rate that is higher than the first rate during the first time period.

15. A method for providing a programming voltage wherein a supply voltage is provided by a voltage source the method comprising the steps of:

providing a pull-up voltage in response to the supply voltage, the pull-up voltage being higher than the supply voltage;

providing a control signal to a first P type load transistor having a source that receives the pull-up voltage, and a drain coupled to an output terminal that provides the programming voltage, so that the first P type load transistor operates in a non-saturated mode during a first time period; and modifying the control signal so that the first P type load transistor operates in a saturated mode during a second time period after the first time period.

16. The method of claim 15, wherein the programming voltage provided by the Output terminal increases at a first rate during the first time period, and wherein the method further comprises a step of:

providing a control signal to a second P type load transistor having a source that receives the pull-up voltage, and a drain coupled to the output terminal that provides the programming voltage so that the second P type load transistor is turned on during a third time period, and is turned off during the first time period, wherein the third time period occurs before the first time period, and wherein the second P type load transistor is larger in size than the first P type load transistor so that, when the second P type load transistor is turned on during the third time period, the programming voltage provided by output terminal increases at a second rate that is higher than the first rate during the first time period.

* * * * *